United States Patent
Lu

(10) Patent No.: US 11,520,391 B1
(45) Date of Patent: Dec. 6, 2022

(54) POWER SUPPLY FOR A MINING MACHINE

(71) Applicant: AA Power Inc., Boston, MA (US)

(72) Inventor: Qun Lu, Lexington, MA (US)

(73) Assignee: AA Power Inc., Boston, MA (US)

( * ) Notice: Subject to any disclaimer, the term of this patent is extended or adjusted under 35 U.S.C. 154(b) by 0 days.

(21) Appl. No.: 17/587,011

(22) Filed: Jan. 28, 2022

Related U.S. Application Data

(60) Provisional application No. 63/290,387, filed on Dec. 16, 2021, provisional application No. 63/272,877, filed on Oct. 28, 2021, provisional application No. 63/232,298, filed on Aug. 12, 2021, provisional application No. 63/189,903, filed on May 18, 2021, (Continued)

(51) Int. Cl.
  *G06F 1/20* (2006.01)
  *H05K 7/20* (2006.01)

(52) U.S. Cl.
  CPC ............ *G06F 1/206* (2013.01); *H05K 7/209* (2013.01)

(58) Field of Classification Search
  CPC ....... H01L 2023/405; H01L 2023/4037; H01L 2023/4043; H01L 2023/4062; H01L 2023/4068; H01L 23/345; H01L 23/34; H05K 7/209; H05K 1/0203; H05K 2201/10166; H05K 3/0061; H05K 7/1432; H05K 1/0204; H05K 1/181; H05K 2201/066; H05K 1/0206; H05K 7/20854; H05K 7/20409; H05K 1/0201; H05K 7/205; H05K 3/301; H05K 1/115; H05K 7/2089; H05K 2201/10969; H05K 2201/10416; H05K 3/202; H05K 7/1427; H05K 3/303; H05K 7/20963; H05K 7/20154; H05K 5/00; G06F 1/20; G06F 1/26; G06F 1/183; G06F 1/184; G06F 1/188; G06F 1/18; G06F 1/189
  See application file for complete search history.

(56) References Cited

U.S. PATENT DOCUMENTS

| | | | | |
|---|---|---|---|---|
| 4,177,499 A | * | 12/1979 | Volkmann | H05K 7/209 |
| | | | | 361/710 |
| 4,872,102 A | * | 10/1989 | Getter | H02M 7/003 |
| | | | | 361/709 |

(Continued)

FOREIGN PATENT DOCUMENTS

| | | | | |
|---|---|---|---|---|
| CA | 3100919 A1 | * | 11/2019 | ............ A01G 9/24 |
| CN | 207766777 U | * | 8/2018 | |

(Continued)

OTHER PUBLICATIONS

Antminer, Antiminer installation guide, 2017. (Year: 2017).*

(Continued)

*Primary Examiner* — Michael A Matey
(74) *Attorney, Agent, or Firm* — Occhiuti & Rohlicek LLP

(57) ABSTRACT

A cryptocurrency mining rig comprising an ac/dc power supply for providing power to a mining machine includes power-handling circuitry and a passive heat-dissipation system that passively dissipates heat generated by the power-handling circuitry. The passive heat-dissipation system comprises a housing that encloses that power-handling circuitry and a thermal network that provides thermal communication between the power-handling circuitry and faces of the housing.

30 Claims, 7 Drawing Sheets

Related U.S. Application Data provisional application No. 63/188,568, filed on May 14, 2021.

(56) References Cited

U.S. PATENT DOCUMENTS

| | | | | |
|---|---|---|---|---|
| 5,327,324 | A * | 7/1994 | Roth | H05K 7/20854 |
| | | | | 174/16.3 |
| 5,909,358 | A * | 6/1999 | Bradt | H01L 23/4093 |
| | | | | 257/726 |
| 6,257,329 | B1 * | 7/2001 | Balzano | H05K 1/0204 |
| | | | | 165/185 |
| 6,411,514 | B1 * | 6/2002 | Hussaini | H05K 7/209 |
| | | | | 361/689 |
| 6,542,368 | B2 * | 4/2003 | Miyazawa | H01L 23/3675 |
| | | | | 174/16.3 |
| 7,180,739 | B2 * | 2/2007 | Kajiura | H05K 7/20918 |
| | | | | 174/16.3 |
| 7,359,203 | B2 * | 4/2008 | Chen | H05K 7/209 |
| | | | | 361/625 |
| 9,001,513 | B2 * | 4/2015 | Pan | H01L 23/4006 |
| | | | | 174/15.1 |
| 9,295,185 | B2 * | 3/2016 | Icoz | H05K 7/20927 |
| 9,443,786 | B1 * | 9/2016 | Rippel | H01L 25/115 |
| 10,691,528 | B1 * | 6/2020 | Ferreira | G06F 11/0721 |
| 10,942,195 | B1 * | 3/2021 | Kom | H05K 7/20572 |
| 2002/0006027 | A1 * | 1/2002 | Rodriguez | H05K 7/20909 |
| | | | | 361/688 |
| 2002/0026996 | A1 * | 3/2002 | Krieger | H05K 7/20909 |
| | | | | 165/47 |
| 2002/0141161 | A1 * | 10/2002 | Matsukura | H01L 23/42 |
| | | | | 257/E23.087 |
| 2007/0236894 | A1 * | 10/2007 | Colby | H01L 23/34 |
| | | | | 361/730 |
| 2008/0055862 | A1 * | 3/2008 | Yu | H01L 23/4006 |
| | | | | 257/E23.084 |
| 2009/0103267 | A1 * | 4/2009 | Wieland | H05K 7/20409 |
| | | | | 29/834 |
| 2011/0103119 | A1 | 5/2011 | Sharifipour et al. | |
| 2011/0228529 | A1 | 9/2011 | Patel et al. | |
| 2013/0120946 | A1 * | 5/2013 | Busse | H05K 7/1432 |
| | | | | 361/759 |
| 2014/0027435 | A1 * | 1/2014 | Chou | H05B 3/26 |
| | | | | 219/209 |
| 2017/0018367 | A1 * | 1/2017 | Werker | H01G 2/08 |
| 2018/0005326 | A1 * | 1/2018 | Reid | G06Q 10/06315 |
| 2019/0170338 | A1 * | 6/2019 | Kung | B64D 45/02 |
| 2019/0190261 | A1 * | 6/2019 | Valkov | H02J 1/08 |
| 2019/0252949 | A1 * | 8/2019 | Woody | H02P 27/06 |
| 2020/0089293 | A1 | 3/2020 | Enright et al. | |
| 2021/0226467 | A1 * | 7/2021 | Chien-An | H05K 7/20172 |

FOREIGN PATENT DOCUMENTS

| | | |
|---|---|---|
| DE | 112012005226 B4 | 2/2019 |
| EP | 3575919 A1 * | 12/2019 |
| KR | 101229656 B1 | 2/2013 |

OTHER PUBLICATIONS

Japanese Company GMP, Bitcoin mining device, 2018. (Year: 2018).*

Zhang, Lei, With symmetrical radiating structure of circuit board and computing device, CN 207766777 English translation. (Year: 2018).*

* cited by examiner

POWER SUPPLY FOR A MINING MACHINE

RELATED APPLICATIONS

This application claims the benefit of the May 14, 2021 priority date of U.S. Provisional Application 63/188,568, the Oct. 28, 2021 priority date of U.S. Provisional Application 63/272,877, the May 18, 2021 priority date of U.S. Provisional Application 63/189,903, the Aug. 12, 2021 priority date of U.S. Provisional Application 63/232,298, and the Dec. 16, 2021 priority date of U.S. Provisional Application 63/290,387, the contents of which are herein incorporated by reference.

TECHNICAL FIELD

The invention concerns mining rigs for mining cryptocurrency and in particular to converting a time-varying voltage into a steady voltage for use when carrying such mining.

BACKGROUND

With the growing popularity of virtual currency, it has become necessary to provide mining rigs to mine for such currency. These mining rigs include mining machines that require considerable power to operate. This power is provided by a power supply that converts AC voltage into the DC voltage required for operating the mining machine.

The various circuits required to carry out the foregoing power conversion generate considerable amounts of heat. Since excessive heat accumulation is undesirable, it is usual to provide a cooling mechanism. A typical power supply uses a fan to promote heat dissipation.

Although a fan is effective at heat dissipation, it carries some disadvantages. First, the fan itself has a cost. Secondly, the fan requires additional power to spin. Third, the fan, like any mechanical part, is vulnerable to breakdown. Fourth, the fan draws air into the power supply, which in turn means that the components are exposed to dust, moisture, and other undesirable objects. And fifth, a fan creates noise. When many mining rigs are present, this noise can be deafening.

It is also possible to use a liquid cooling system in lieu of a fan. While this avoids the problems of dust, a liquid cooling system is also vulnerable to breakdown. For example, in a liquid cooling system, one replaces the fan with a liquid pump, which, like a fun, can break down and also consume power. Moreover, the need to provide coolant and piping to convey the coolant imposes considerable cost and creates further opportunities for failure, for example due to leakage. This further increases the cost associated with liquid cooling.

SUMMARY

The invention is based on the recognition that a thermal transport network that provides thermal communication between heat-generating components and the housing of a power supply makes it possible to dissipate heat passively in much the same way that mammals can dissipate internally-produced heat through skin. This contradicts the expectation that power supplies that handle significant amounts of power cannot be cooled quickly enough using purely passive means.

In one aspect, the invention features a mining rig having an ac/dc power supply for providing power to a mining machine. Such a power supply includes power-handling circuitry and a passive heat-dissipation system that passively dissipates heat generated by the power-handling circuitry. The passive heat-dissipation system comprises a housing that encloses the power-handling circuitry and a thermal network that provides thermal communication between the power-handling circuitry and faces of the housing.

Embodiments include those in which the thermal network comprises a printed-circuit board and at least one thermally-conductive medium disposed between the printed-circuit board and the housing. Examples of such a medium include a paste or sponge. Other examples include a pliable or flexible material that conforms easily to irregular surfaces and fills gaps between irregular surfaces. Among these are embodiments in which only one thermally-conductive medium is used. Also among these are embodiments in which two or more thermally-conductive media are used.

In some embodiments, the thermal network includes a conducting region, such as a strip, that has been inlaid into a face of the housing, such as into a recess formed in the housing's face. In such embodiments, the conducting strip has a thermal conductivity that is greater than that of the housing.

Other embodiments include those in which the thermal network comprises a printed-circuit board having an opening and in which the power-handling circuitry comprises a power unit that has a portion that passes through the opening so as to be in thermal communication with the housing.

Also among those embodiments in which the thermal network comprises a printed-circuit board are those in which the printed-circuit board includes one or more heat-conducting layers. In such embodiments, the power-handling circuitry comprises one or more power-handling units, or "power units," that are surface mounted onto the printed-circuit board. These power units create localized regions of elevated temperature during operation thereof.

A multilayer printed-circuit board to which these power units have been surface mounted has a tendency to spread the heat energy that is concentrated in these regions of elevated temperature and to ultimately conduct this heat energy to the housing through a thermally-conductive medium. This permits the heat energy to be dissipated passively into the environment without the need for a fan or another mechanical contrivance.

In such embodiments, the printed-circuit board serves dual functions. It serves its conventional function of providing a place to mount various components. But, as a side effect of its ability to conduct heat energy, it simultaneously plays a crucial role in dissipation of heat generated by those very components that it supports.

A connection between the printed-circuit board and the thermally-conductive medium provides the basis for a hub-and-spoke thermal network in which the printed-circuit board forms the hub. As a heat-spreading hub for the thermal network, the printed-circuit board collects heat energy from multiple components and diverts it to different parts of the housing's faces for eventual passive dissipation into the environment.

The resulting flow of heat through the thermal network is driven by a heat gradient. This has the advantage of causing heat to flow faster as the circuitry heats up, thus creating a positive feedback loop in which an increase in temperature also causes an increase in the rate of heat flow. Such a positive feedback loop does not exist in the case of an actively cooled system, such as that cooled by a fan.

Within the art, it has long been believed that the amount of heat being generated by a power supply that powers a mining machine is so great that it cannot possibly be dissipated passively. However, contrary to this conventional wisdom, the invention demonstrates that by careful design of a thermal network, it is possible to maintain a suitable operating temperature without the need for a fan.

Among the features of a thermal network that strategically promote heat dissipation is a projection that is in thermal communication with the housing and that projects into the housing. In such embodiments, the projection includes a thermally-conductive body having an end that is in thermal communication with a face of the housing. The power-handling circuitry comprises a power unit that is in thermal communication with the body. As a result, the projection serves as a thermal expressway that rapidly conducts heat from a power unit to the housing. This permits extraction of heat from structures that are deep in the interior of the power supply and far from any walls.

Also among the features that will strategically promote heat dissipation is a projection that is not only in thermal communication with the housing but also offers a recess into which it is possible to nestle a power unit. This is particularly useful for those power units, such as an electrolytic capacitor, that inherently have a cylindrical body that can be nestled within a semicircular recess. As a result, it is possible to increase the surface area available for heat conduction even for curved objects.

To further promote heat dissipation, particularly from irregularly shaped components and/or components that are a considerable distance from the wall, it is useful to fill the entire housing with a thermally-conductive but electrically-insulating fluid that will harden over time, such as a polymer that cures over time. As a fluid, such a material is able to penetrate interstices within the housing and to surround irregularly shaped structures, thus maximizing the surface area over which heat dissipation.

In some embodiments, interior surfaces, both of the housing and the components within, are treated to form an oxide layer that is somewhat rough, thus increasing contact area available for conduction.

In still other embodiments, the thermal network comprises a grounded electrically-conducting plate that is between a power unit and the housing. Such a plate is also thermally conductive.

Among the embodiments are those in which the thermal network comprises a thermally-conductive adhesive and the power-handling circuitry comprises a power unit that is in thermal communication with the adhesive. In such embodiments, the adhesive is disposed between the power unit and the housing. As a result, the power unit achieves thermal communication with the housing via the adhesive.

In still other embodiments, the thermal network comprises a perforated graphene layer and the power-handling circuitry comprises a power unit that is in thermal communication with the graphene. Among these embodiments are those in which a thermally-conductive material, such as a thermally-conductive adhesive or thermally-conductive sponge fills the perforations in the graphene layer, thereby promoting thermal conductivity in a direction transverse to that in which the graphene has its maximum conductivity.

Embodiments include those in which the power supply is mounted so that at least one and preferably more of its faces are in contact with a heat sink. Suitable heat sinks include a mining machine or a rack that holds plural mining machines.

In some embodiments, the housing comprises multiple faces and the thermal network is in thermal communication with all of the faces.

Still other embodiments include those in which the housing comprises opposed faces, each of which has a vent and those that include fins on the housing.

Because the power supply's housing can become quite hot, it is useful to have a warning system. Among the embodiments are those that include a heat sensor that senses the housing's temperature. Among these are embodiments in which a warning system provides an alert in response to detecting that a temperature of the housing exceeds a threshold value.

In some embodiments, it is useful to restrict access to the power supply when it is still too hot to touch. Among these are embodiments having an access panel that is locked when a temperature of the housing is above a threshold and unlocked otherwise, wherein the access panel permits access to the power supply.

Embodiments further include those in which the power-handling circuitry comprises a power semiconductor device that is in thermal communication with the thermal network, those in which it comprises an electrolytic capacitor that is in thermal communication with the thermal network, and those in which it comprises a magnetic core and windings that are both in thermal communication with the thermal network.

The housing is a three-dimensional structure having considerable surface area. A particularly common form factor for such a housing is a rectangular prism. Such a prism has six faces, all of which are in thermal communication with each other. As such, heat transferred to any one face of the housing wall is able to ultimately radiate or otherwise dissipate into the environment through all faces of the housing wall.

By essentially converting the entire housing into a heat sink, it becomes possible to considerably magnify the housing's ability to radiate heat rapidly enough to maintain a suitable operating temperature within the power supply.

To further promote rapid heat dissipation, some embodiments feature one or more additional metal radiators that have been attached to corresponding one or more of the housing faces in such a way that thermal communication likewise exists between that face and its corresponding additional metal radiators. Among these structures are finned structures.

In some embodiments, the walls of the housing are thickened relative those of power-supply housings for comparable AC-DC power converters that rely on a fan. This promotes more rapid heat conduction throughout the housing, thus promoting a more spatially constant heat distribution throughout the housing's wall.

In some embodiments in which rack-level power architecture is to be used, the additional metal radiator takes the form of a metal rack having layers that support power supplies. In such cases, the housing contacts the rack, which is typically a metal structure that therefore efficiently conducts heat. As a result, heat energy in the housing's wall is able to be conducted into the metal rack and dissipated over a significant area.

Among other advantages, by using the above method, the power supply housing conducts the received heat into the mining machine's environment. This permits cooling the power supply without using any active cooling system. As a result, the power supply costs less to make and uses less power than comparable power supplies that rely on an active cooling system. Furthermore, operating noise can be significantly reduced and the lifespan and reliability of the ac power supply for equipment can be increased.

In some embodiments, the thermal resistors comprise a printed-circuit board, which is arranged close to an interior side of a first wall of the power supply housing and is directly or indirectly connected to the inner side wall of the power supply housing, one or a plurality of the power-handling units are arranged on a first side surface of the printed-circuit board away from the inner side of the first wall.

In some embodiments, a thermally-conducting medium fills the space between the printed-circuit board and the first inner side wall. The medium is initially fluid but cures to a solid.

In some embodiments, a printed-circuit board disposed close to the first inner side wall of the power supply housing has an opening. One or more side ends of the heat-conducting structure are connected to the first inner side wall to establish thermal communication. A body portion of the heat-conducting structure extends through an opening in the printed-circuit board and contacts the housing to establish thermal communication between the power-handling unit and the housing.

In some embodiments, a concave accommodating portion is formed on the main body portion of a thermally-conducting structure and a power-handling unit is at least partially embedded in the concave accommodating portion.

In some embodiments, a perforated printed-circuit board is arranged close to an inner wall of the housing. The board includes an opening through which an end of a power-handling unit extends to provide thermal communication with the housing's wall.

In some embodiments, the power-handling unit comprises a patch-type power semiconductor element.

In some embodiments, the power-handling circuitry includes a through-hole type power semiconductor element in thermal communication with the thermal network. Among these are embodiments in which the power semiconductor element is in thermal communication with a thermally-conductive medium or the inner side wall of the power supply housing, and the pins of the second power-handling unit are inserted into the pin through holes of the printed-circuit board.

In some embodiments, the power-handling circuitry includes a power-handling unit that has a magnetic core and a winding. In such embodiments, the magnetic core is in thermal communication with the printed-circuit board. In other embodiments, the magnetic core is in thermal communication with a projection that projects into the housing and provides thermal communication with a face of the housing. In some embodiments, the windings are in thermal communication with the printed-circuit board, for example by having been soldered thereto, or connected to the second region of the projection.

In some embodiments, a thermally-conductive glue is filled between at least part of the outer side wall of the power-handling unit and the side surface of the printed-circuit board so that the power-handling unit is in thermal communication with the housing through the thermally-conductive glue.

In some embodiments, a heat-dissipation fins are arranged on one or more outer side walls of the power-supply housing.

Further embodiments include those that comprise a shield against electromagnetic interference by said power supply. Examples of such a shield include an enclosing conducting structure connected to ground. Embodiments include those in which the shield is a solid conducting structure and those in which it takes the form of a conductive cage and those in which it takes the form of a conductive layer. Further embodiments include those that suppress electromagnetic interference of both conductive and radiative origin and those that suppress only electromagnetic interference of conductive origin.

Still other embodiments include a heat sensor that is configured to measure a temperature of said power supply and a safety device coupled to said heat sensor so that the safety device changes state in response to temperature. Examples of a suitable safety device include a light that illuminates when said temperature crosses a threshold and those in which the safety device comprises a lock that prevents access to said power supply when the temperature is higher than a threshold.

In some embodiments, vents at opposing faces of the housing permit air to flow through the housing in much the same way that open windows of a house permit a breeze to flow through the house. In such embodiments, it is typical to have only two such vents, one on each end, to promote such passive ventilation. In particular, it is useful to avoid having additional vents in the remaining two walls since such vents would have the effect of disrupting the airflow through the housing.

In still other embodiments, the thermal network comprises a perforated graphene layer and the power-handling circuitry comprises a power unit that is in thermal communication with the graphene. Preferably, a thermally-conductive material, such as a thermally-conductive adhesive or thermally-conductive sponge fills the perforations in the graphene layer, thereby promoting thermal conductivity in a direction transverse to that in which the graphene has its maximum conductivity.

In some embodiments, a thermally-conductive polymer is filled between at least part of the outer side wall of the power-handling unit and the side surface of the printed-circuit board so that the power-handling unit is in thermal communication with the housing through the thermally-conductive polymer.

It is understood that all materials have some non-zero thermal conductivity and therefore all materials are thermal conductors to some extent. However, it is also true that all materials have some non-zero thermal resistance, which would mean that all materials are also insulators to some extent. In recognition of this logical difficulty, the term "heat-conductive medium" and cognates and variants therefore shall be construed to cover only those materials that the ordinary artisan would have regarded as being thermal conductors and therefore does not include all materials that have non-zero thermal conductivity.

It is also understood that all electrical components handle power to some extent since power is simply the product of voltage and current. However, this does not mean that all components are regarded by the skilled artisan as power-handling components. As used herein, "power-handling circuitry," "power units," and similar terms exclude components that handle power but that would not be regarded by the ordinary artisan as being "power-handling components" or "power units."

As a result of avoiding an active cooling system, an apparatus as described herein achieves numerous advantages. Among these are a reduction in power consumption and an increase in reliability.

Among the power supplies as described herein are those that output significant amounts of power, such as those that output in excess of five hundred watts, those that output in excess of three kilowatts, those that provided sustained power outputs of four thousand watts, and those that provide sustained power outputs of five thousand watts. While those with limited technical understanding of power engineering may believe that the wattage of a power supply is a mere design choice, in fact, there exist significant structural differences between power supplies with low output power and the power supplies described herein.

DESCRIPTION OF DRAWINGS

These and other features of the invention will be apparent from the following detailed description and the accompanying figures, in which.

Within the drawings, the same or corresponding reference numerals indicate the same or corresponding parts.

DETAILED DESCRIPTION

Figure 1:
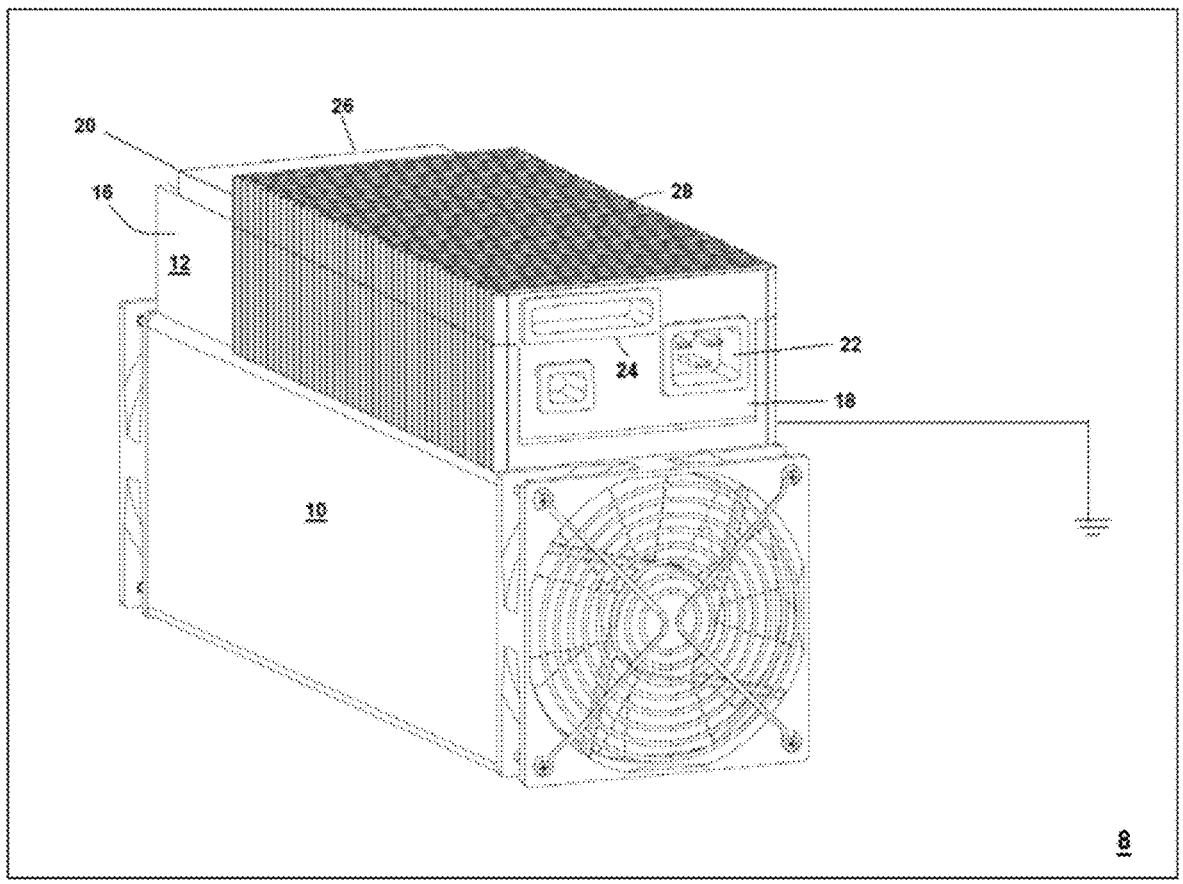
FIG. 1 shows a cryptocurrency mining rig comprising a mining machine and a power supply disposed thereon.

FIG. 1 shows a mining rig 8 comprising a mining machine 10 for mining virtual currency. The mining machine 10 receives ac power transmitted from an electric utility. This ac power is generally unsuited to operating the mining machine 10. It must be converted into suitable dc power. To carry out such a conversion, it is useful for the mining rig 8 to also include a power supply 12 to convert ac power into suitable dc power. A suitable power supply 12 is an ac/dc converter.

The process of converting ac power into dc power generates waste heat. To dissipate this waste heat, the power supply 12 implements a passive thermoregulation system. This passive system does not rely on a fan or another active cooling mechanism. Such passive thermoregulation avoids the increased cost, reduced reliability, and operating noise of power supplies that rely on active cooling.

The power supply 12 comprises a housing 14 having faces 16 made of a first material. In typical embodiment, the first material is one having high thermal conductivity and high emissivity. A useful first material is a metal. Because of its low cost, aluminum is a particularly useful metal. Anodizing the aluminum further improves its emissivity.

In some embodiments, it is useful to incorporate a second material that has a thermal conductivity higher than that of the first material. This can be carried out either by coating the first material with the second material or by inlaying pieces of second material into the first material. This is useful for rapidly spreading heat across multiple faces 16 of the housing 14, thereby avoiding hot spots. Examples of a second material include graphite and copper.

In the illustrated embodiment, the housing 14 takes the form of a rectangular prism having six faces 16 that are in thermal communication with each other. Each of these faces 16 dissipates heat into the ambient air. Having plural heat-dissipating faces 16 greatly increases the rate at which heat can be dissipated from the power supply 12. In addition, having plural heat-dissipating faces 16 also provides greater flexibility in the construction of thermally-conductive pathways between internal heat-generating components and the faces 16.

The six faces include a first end-face 18 and a second end-face 20 at opposite ends of the housing 14. The first end-face 18 includes a socket 22 for receiving the input ac power.

In some embodiments, the first and second end-faces 18, 20 also feature corresponding first and second vents 24, 26. The vents 24, 26 permit air to flow through the housing 14 in much the same way that windows in a house passively allow air to flow through the house. Preferably, the vents 24, 26 are made only on opposite faces of the housing 14 such that a path between the openings is parallel to the direction of expected air flow within in the vicinity of the power supply 12. Vents located on the other faces of the housing 14 would be likely to disrupt this air flow and thus impair cooling efficiency.

The vents 24, 26 make it possible for the power supply 12 to dissipate heat by a mechanism other than radiation. In particular, the vents 24, 26 make it possible to exploit sources of moving air that may already be present in the environment.

For example, many mining machines 10 operate in the vicinity of fans and other sources of convection. The power supply 12, with its vents 24, 26, is configured to exploit such fans or sources of convections. By suitably orienting the vents 24, 26, it is possible to use the kinetic energy of that moving air to draw air through the housing 14.

The fact that the power supply 12 takes advantage of an existing fan does not change the fact that the power supply 12 itself does not have a constituent fan or that it does not carry out active cooling. These would continue to be true for much the same reason that a human being who sits in front of an electric fan to cool off would not be said to have an internal organ that corresponds to a fan. The fact that a power supply 12 cools passively does not preclude the possibility of the power supply 12 taking advantage of features in its environment in order to do so. A passively-cooled power supply 12 is certainly permitted to take advantage of the benefit of moving air to dissipate heat for the same reason that a human can do the same. It makes no difference whether the moving air moves as a result of a fan or other mechanical contrivance or whether it moves as a result of denser air sinking downwards and displacing more rarefied air. The physical principles are the same.

Figure 5:
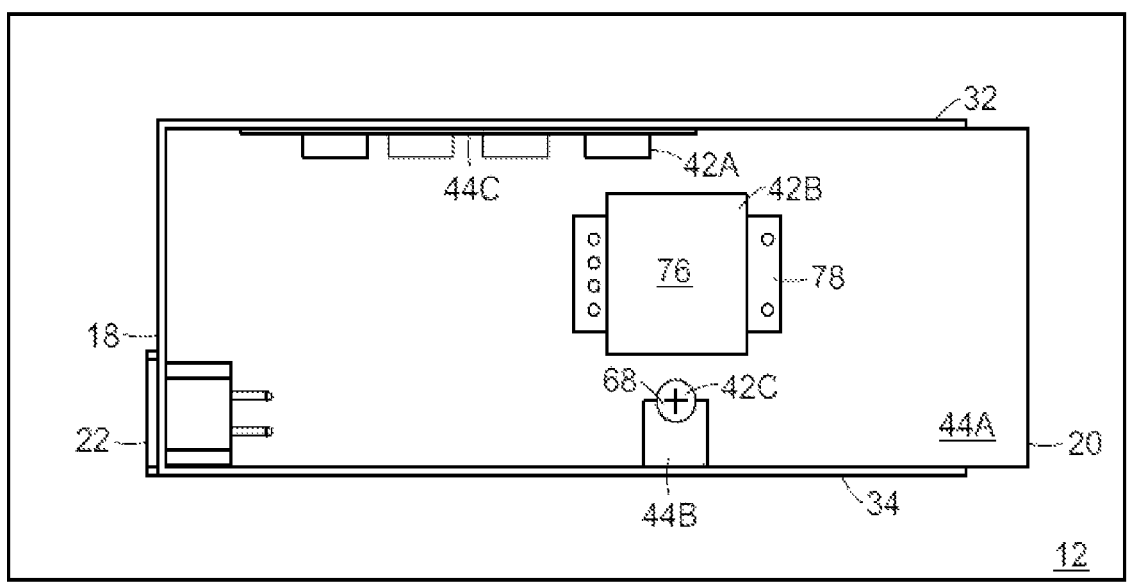
FIG. 5 shows a plan view of circuitry seen in FIG. 2 for use in a dusty environment in which no air vents have been provided.

In some cases, the mining machine 10 is operated in an environment in which the air is dusty. For example, many mining machines 10 operate outdoors to take advantage of naturally cold winter air. In such cases, having vents 24, 26 is likely to admit dust or contaminants, which may impair operation. For such applications, it is useful to dispense with the vents 24, 26, as shown in the embodiment of FIG. 5.

In some embodiments, the power supply 12 includes fins 28 on a face 16 thereof. Embodiments include those in which fins 28 are placed on any or all faces 16 except those faces 16 or portions thereof in which the presence of fins 28 would impede the performance of another function, such as in or around the socket 22 or in an installation area. These fins 28 promote heat dissipation.

Figure 2:
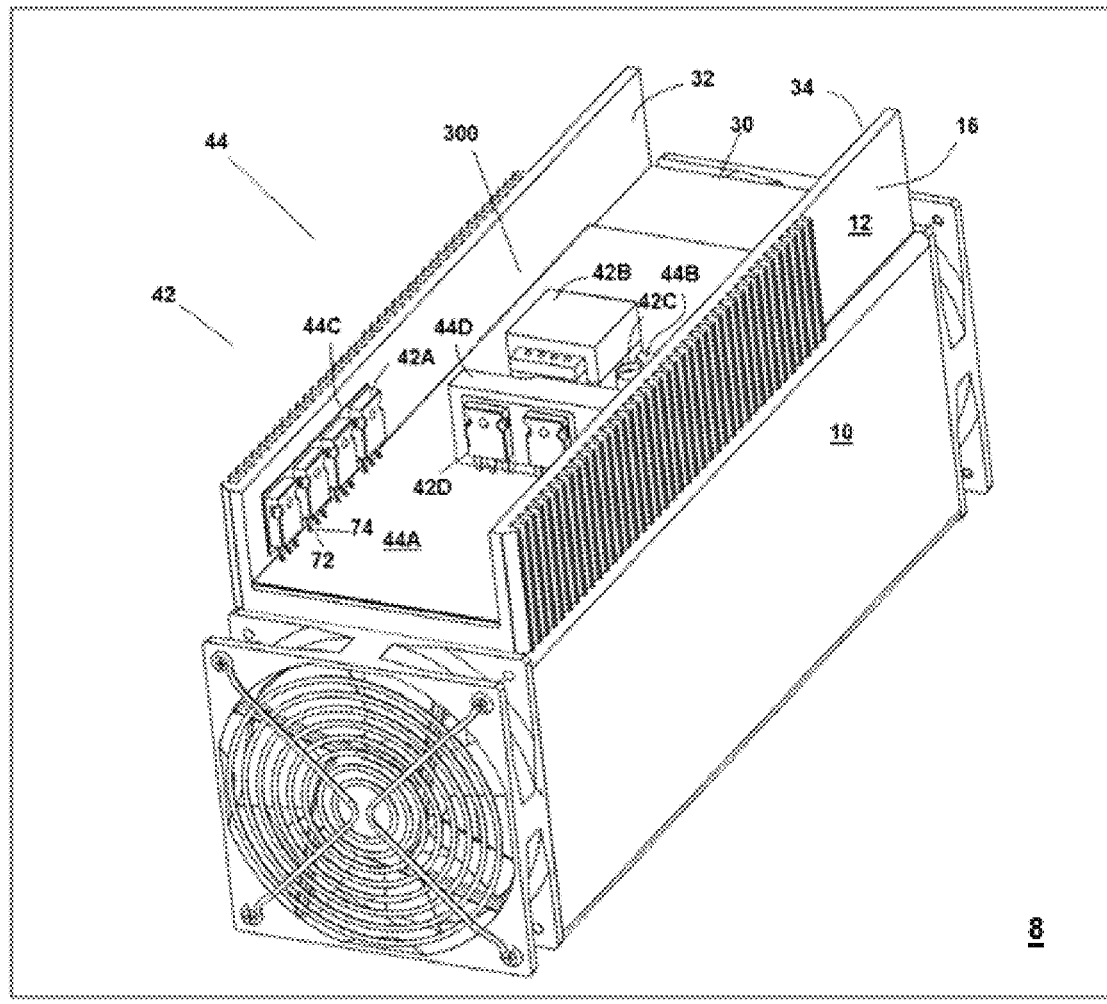
FIG. 2 shows the power supply of FIG. 1 with faces having been removed to show typical components of a thermal network and power-handling circuitry.

FIG. 2 shows the power supply 12 of FIG. 1 but with certain faces 16 having been removed from the housing 14. Among the remaining faces 16 that can be seen in FIG. 2 are a floor 30, a first sidewall 32, and a second sidewall 34 that is opposite the first sidewall 32.

As shown in FIG. 2, the power supply 12 comprises power-handling circuitry 42 and a thermal network 44.

The thermal network 44 is a passive solid-state network that provides solid state paths of high thermal conductivity between components of the power-handling circuitry 42 and the faces 16 of the housing. In many cases, the thermal network 44 provides a solid-state thermal path between a component and two or more faces 16 of the housing so as to minimize the magnitude of the temperature-gradient vector on the faces 16. As a result, during steady-state operation, the faces 16 are all at the same temperature, with essentially no hot spots being detectable.

Conceptually, the thermal network 44 defines a thermal circuit that coexists with the power-handling circuitry 42. Jus as the power-handling circuitry 42 provides electrically-conductive paths between points at different voltages so that electric current can flow therebetween, the thermal network 44 provides thermally-conductive paths between points at different temperatures so that heat energy can flow therebetween.

It is true that, due to the second law of thermodynamics, heat generated by the power-handling circuitry 42 will eventually find its way to the faces 16 of the housing 14. However, the second law has nothing to say about the rate at which this occurs. By providing a thermal network 44 of solid-state conducting paths between heat sources within the power-handling circuitry 42 and the housing's faces 16, it is possible to conduct heat energy rapidly and in copious quantities from the heat sources to multiple faces 16 of the housing 14. In particular, it is possible to do so at a rate that matches the rate at which the power-handling circuitry 42 generates heat. As a result, the thermal network 44 makes it possible for the power-handling circuitry 42 to engage in sustained operation at a suitable operating temperature.

The power-handling circuitry 42 comprises various kinds of power-handling units that generate heat as a waste product. Examples of the different kinds of power-handling units include a power semiconductor device 42A, a transformer 42B, and a capacitor 42C. A particularly useful type of capacitor 42C, because of its ability to store considerable charge in a small area, is an electrolytic capacitor.

An electrical circuit has components of various impedances that relate the driving force, namely a voltage difference, to something that flows, namely electric current. The thermal network 44 likewise has components, referred to herein as "thermal resistors," that have thermal resistances. These thermal resistances likewise relate a driving force, namely a temperature difference, to something that flows, namely heat energy.

The thermal network 44 comprises thermal resistors having low thermal resistances. The thermal resistors connect the faces 16 of the housing 14 to the various power-handling units of the power-handling circuitry 42 so as to form a network of solid-state heat-transfer paths that conduct heat energy generated by the power-handling circuitry 42 to the housing's faces 16 for eventual dissipation into the environment of the mining machine 10. Some thermal resistors connect directly to a face 16. Others connect indirectly to the face 16 via another thermal resistors. Examples of thermal resistors having low thermal resistance include a printed-circuit board 44A, a projection 44B, 44D, a thermally-conductive medium 44C, examples of which can be seen in FIG. 2. Another example is an electromagnetic-interference shield 44E, which can be seen in FIG. 3. Yet another example is an inlaid thermally conducting strip 44F, which can be seen in FIG. 9.

Passive heat dissipation is carried out by using the thermal network 44 to conduct heat generated by the power-handling circuitry 42 to the faces 16 of the housing 12 rapidly enough so that the equilibrium temperature of the power-handling circuitry 42 remains within a specified range during normal operation of the power supply 12. This is achieved by strategic placement of the various power-handling units relative to thermal resistors of the thermal network 44.

Each power-handling unit is ultimately in thermal communication with one or more faces 16 of the housing 14 through one or more of the thermal resistors. Some are in thermal communication with two or more faces 16. However, the power-handling units remain electrically isolated from the housing 14 and from each other. As a result, the power-handling units avoid causing conduction current on the faces 16 of the housing 14.

An advantage of having plural faces 16 all cooperating to dissipate heat into the ambient air is that there are more choices when designing a thermal network 44 to move the heat. Instead of having all power-handling circuitry 42 be in thermal communication with the same face 16, it becomes possible to connect different power-handling units to different faces 16. It also becomes possible to connect a power-handling unit to two or more faces 16. In effect, the ability to use all faces 16 of the housing 14 creates what amounts to an omnidirectional heat sink that transfers thermal energy directly into the ambient environment, such as the ambient air or to a metal rack. The housing 14 is thus a biomimetic structure that carries out heat dissipation in a manner similar to that adopted by many warm-blooded animals, in which the entire surface of the skin is available for dissipation of internally-generated heat without the need for an active heat-dissipating organ that would be analogous to a fan.

In FIG. 2, all faces 16, including those concealed or omitted, are available for receiving heat energy from the power-handling circuitry 42. In effect, the entire housing 14 is available for use in connection with dissipating heat. This is different from a conventional circuit having a heat sink. In effect, the structure shown in FIG. 2 defines a heat sink that completely encloses the power-handling circuitry 42 thereby cutting it off from any cooling air. The conventional wisdom is such that a circuit enclosed in this way would quickly overheat. However, by careful design of a thermal network to connect the power-handling circuitry 42 to the housing 14, it has been found possible to create thermal superhighways that convey heat to the housing's walls so that it can be dissipated as fast as it is produced. This results in a power supply in which the power-handling circuitry 42 is effectively sealed from the outside environment and yet manages to avoid overheating.

In the power supply 12 shown, no active heat-dissipation is required. Unlike conventional power supplies, the illustrated power supply 12 mimics the manner in which heat dissipation is carried out by human beings, namely by conducting metabolically-generated heat to a surface, i.e., the skin, that is exposed to the environment. In the power supply 12, the thermal network 44 draws internally-generated heat to what amounts to the power supply's skin, namely the union of all the faces 16 that form the power supply's housing 14. This permits heat dissipation into the environment of the mining machine 10.

It should be noted that this mimicry is not entirely complete. In a human being, heat conduction to the skin is facilitated by blood that flows along tubes that are close to the skin's surface. In the illustrated power supply 12, no liquids are necessary. The process of heat transfer is carried out entirely in the solid state. Instead of relying on convection by fluid, whether it be gas or liquid, heat transfer via the thermal network 44 is mediated by the same valence electrons that are normally used to conduct electricity or, in the case of non-electrically conductive media, through phonons propagating through the material's crystalline structure.

By having eliminated the fan, the illustrated power supply 12 significantly reduces power consumption and operating noise relative to that of comparable power supplies that rely on having a fan for cooling during normal operation. Moreover, since the fan is among the first components to fail, the power supply's operating lifetime and reliability are significantly greater than those of a comparable power supply that relies on a fan.

The foregoing advantages exist in connection with having eliminated forms of active cooling as well, such as liquid cooling systems. Active cooling systems typically require a pump, fan, or other mechanical contrivance that is ultimately subject to wear and failure and that ultimately adds cost.

The power supply 12 features a passive thermo-regulation system in which thermally-conductive pathways formed by a thermal network 44 provide thermally-conductive paths that connect heat-generating components of a power-handling circuitry 42 to the faces 16 of the housing 14. These paths are solid-state paths, thus eliminating the disadvantages of relying on liquid for heat transfer. The faces 16 collect this heat energy and dissipate it by a combination of convection, radiation, and conduction. The passive thermo-regulation system thus promotes the power supply's ability to achieve thermal homeostasis without the use of moving parts, such as fans.

The power supply 12 dissipates heat by convection because the housing 14 is exposed to ambient air. As the thermal network 44 brings heat energy to the housing's faces 16, the elevated temperature of the faces 16 heats nearby air, thus expanding it and causing convection.

In some cases, nearby fans or ventilation sources promote the aforementioned convection mechanism by blowing air past the housing 14. In such cases, the power supply's ability to dissipate by convection benefits from such air movement in much the same way that a human's ability to dissipated metabolically-generated heat benefits from exposure to a cooling breeze. However, just as the source of a cooling breeze is separate and apart from the person who benefits from it, so too is the source of additional convection in the data room 12 separate and apart from the power supply 12.

The power supply 12 dissipates heat by radiation because the housing's faces 16, being at an elevated temperature, radiate electromagnetic waves in a manner analogous to a blackbody radiator. This mode of heat dissipation is carried out independently of convection and in fact occurs even in a vacuum.

The power supply 12 also dissipates heat by conduction because the housing's faces 16 are in thermal communication with another thermally-conductive structure that serves as a heat sink. For example, in FIG. 1, power supply 12 is on a mining machine 10. As a result, the mining machine 10 acts as a heat sink.

The housing's ability to rapidly dissipate heat arises in part from the use of more than one of its faces 16 for heat dissipation. In the case of the illustrated housing 14, which takes the form of a rectangular prism, all six faces 16 are used for heat dissipation.

Moreover, in an effort to promote more rapid conduction throughout the housing 14, thus promoting a more even spatial distribution of heat, it is useful to thicken the housing's faces 16 relative to those that are used in comparable power supplies that rely on a fan. This also serves the function of increasing the amount of heat energy that would be required to raise the temperature of the housing's faces 16.

In a preferred embodiment, the thickness of the housing's faces 16 is greater than one millimeter. Among these are embodiments in which the thickness is at least three millimeters. The additional thickness also makes it possible to countersink screws holding the housing 14 together. This promotes greater surface contact and thus further promotes heat conduction to the walls.

Referring back to FIG. 2, among the thermal resistors of the thermal network 44 is a printed-circuit board 44A that is disposed near the floor 30 and that is in thermal communication, either directly or indirectly, with the housing 14. Examples of a printed-circuit board 44A include those made of fiberglass and epoxy laminate, such as FR4, and those with a metal core to promote heat conduction. Other printed-circuit boards are those that incorporate bromine or another halogen and those that are fire resistant.

An outwardly-facing side of the printed-circuit board 44A is in thermal communication with the floor 30, either directly or indirectly. An inwardly-facing side of the printed-circuit board 44A has components of the power-handling circuitry 42 mounted thereon. Examples of such components include power-handling semiconductor integrated circuits, resistors, diodes, transistors, inductors, and capacitors. Heat generated by these surface-mounted components is transmitted via heat-conducting components of the printed-circuit board 44A directly or indirectly to one or more faces 16 of the housing 14.

Among the foregoing embodiments are those in which the printed-circuit board 44A is a multi-layer printed-circuit board 44A that includes intermediate thermally-conductive layers, such as metal layers. Among these are printed-circuit boards 44A in which the intervening metal layers are as thick as possible. This causes the multi-layer printed-circuit board 44A to more closely approximate a solid metal slab, thus providing a greater ability to absorb more heat energy per unit rise in temperature.

Embodiments include those in which different kinds of power-handling units, such as power integrated circuits 42A, transformers 42B, and capacitors 42C mount to the inwardly-facing side of the printed-circuit board 44A. In some embodiments, a thermally-conductive path between a power-handling unit and the housing 14 extends through an opening in the printed-circuit board 44A to connect that power-handling units with one or more faces 16 of the housing 14.

In the illustrated embodiment, the outwardly-facing side of the printed-circuit board 44A faces the floor 30. However, alternative embodiments include those in which the outwardly-facing side of the printed-circuit board 44A faces the first sidewall 32, those in which it faces the second sidewall 36, and those in which it faces any other face 16, circumference, or periphery of the housing 14 such that heat is transferred by conduction in quantities significant enough to effectively cool the power supply 12 by heat dissipation into the mining machine's environment.

Also among the thermal resistors of the thermal network 44 are regions containing a thermally-conductive medium 44C. Examples of a thermally-conductive medium 44C include a thermally-conductive adhesive, thermally-conductive sponge, or a layer of graphene having perforations therethrough with either thermally-conductive adhesive or thermally-conductive sponge filling the perforations to promote thermal conductivity along the direction transverse to that in which the graphene layer exhibits its maximum thermal conductivity.

It is recognized that all materials have a non-zero thermal conductivity. Accordingly, as used herein, a "thermally-conductive medium" is one that would have been regarded by an ordinary artisan as a thermally-conductive medium.

An example of such a sponge is one made of closed cell silicone that provides both thermal conductivity and electrical isolation. In some embodiments, thermally-conductive medium 44C fills a gap between the printed-circuit board 44A and the floor 30 or between a power-handling unit and either another thermal resistor or the housing. The thermally-conductive medium 44C is particularly useful as a result of its ability to conform to irregular surfaces, thus promoting more efficient heat transfer.

Also among the components of the thermal network 44 are projections 44B, 44D. Each projection 44B, 44D comprises a thermally-conductive body having an end that is in thermal communication with a face 16 of the housing 14. The projection's thermally-conductive body projects inward from the face 16 into the housing's interior, thus providing a thermally-conductive surface to which a power-handling unit 42C, 42D is mounted. This causes heat to be conducted from that power-handling unit 42C, 42D to the housing's face 16.

The projection 44B, 44D is not limited to being in thermal communication with only one face 16. In the embodiments shown in FIGS. 4 and 5, the projection 44B, 44D is in thermal communication with both the second sidewall 34 and the floor 30.

Figure 4:
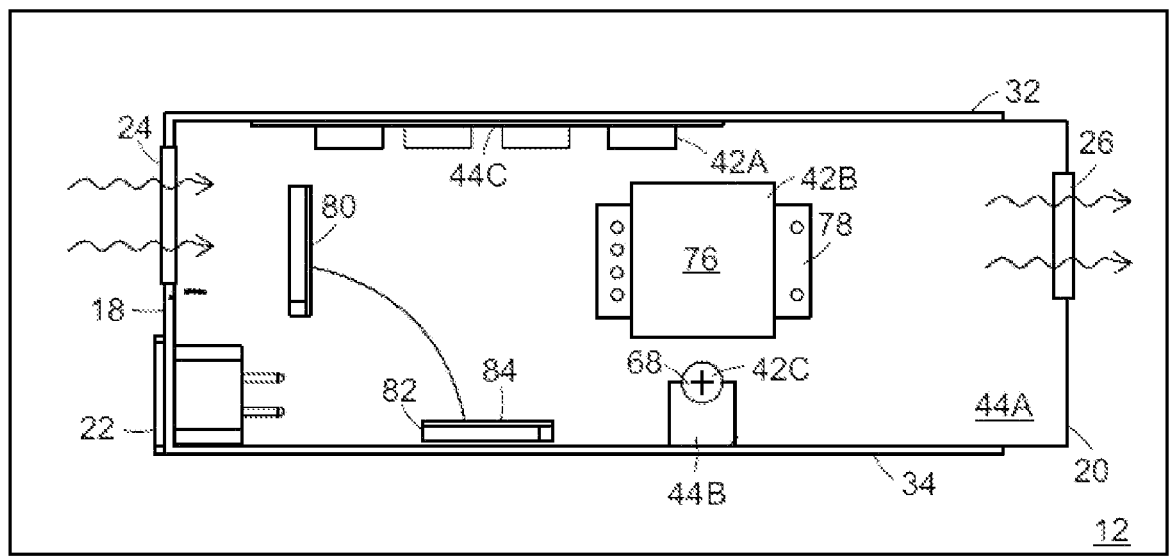
FIG. 4 shows a plan view of circuitry seen in FIG. 2 together with air being passively drawn through vents placed in opposed faces of the housing.

To further promote heat transfer, some embodiments of the projection 44B, including the one shown in FIGS. 4 and 5, feature a recess 68 that conforms to the shape of the power-handling unit 42C. In the illustrated embodiment, the power-handling unit 42C is a cylindrical structure, such as an electrolytic capacitor. As such, the recess 68 is concave and semi-circular. This increases contact area between the power-handling unit 42C and the projection 44B, thus promoting more rapid heat transfer.

Moreover, although the illustrated projection 44B only has one power-handling unit 42C attached to it, the projection 44B is large enough to accommodate more than one power-handling unit. For example, in the illustrated embodiment, it is possible to accommodate additional power-handling units on the sides of the projection 44B.

In the illustrated embodiment, the projection 44B projects along a line. However, embodiments also include those in which the projection 44B follows a meandering path and those in which the projection 44B follows a curved path.

Figure 3:
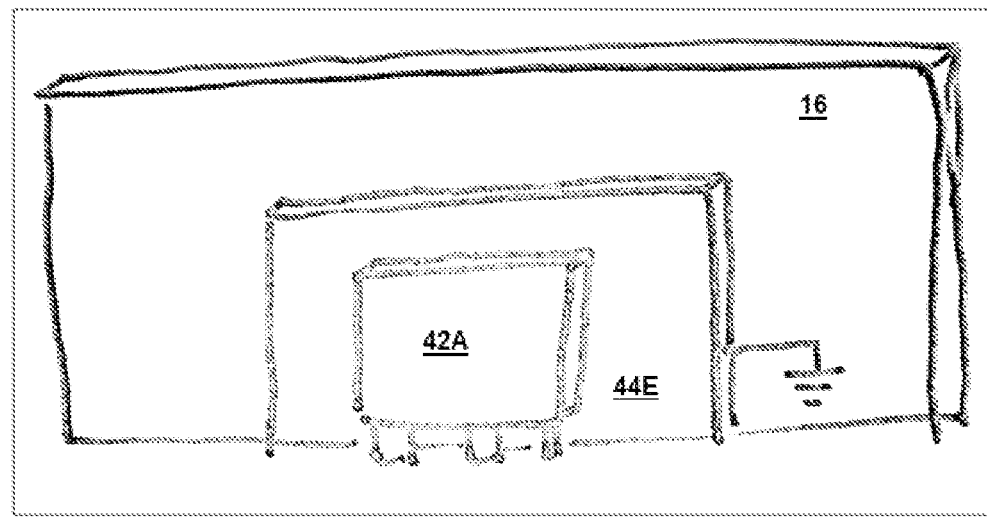
FIG. 3 shows a shield to suppress electromagnetic interference from a power-handling units that are within the housing of the power supply.

In some cases, the thermal connections between the housing's faces 16 and the various internal components of the power supply 12 create a heightened risk of electromagnetic interference due to electrical currents on the housing's faces 16. It is therefore useful for the thermal network 44 to include a shield 44E, as shown in FIG. 3. Such a shield 44E is implemented as a conducting enclosure that has a grounding connection. Such a shield 44E provides both thermal communication with a face 16 and suppression of electromagnetic interference.

FIG. 2 also shows a power-handling unit implemented as a through-hole type power semiconductor device 42A that is indirectly connected to the first sidewall 32 by a thermally-conductive medium 44C. The thermally-conductive medium 44C is electrically isolating. As a result, there exists electrical isolation between the power semiconductor device 42A and the first sidewall 32.

To promote more rapid heat dissipation, it is useful to choose the side of the power semiconductor device 42A that adheres to the thermally-conductive medium 44C to be the side having the largest area. The various pins 72 of the power semiconductor device 42A pass are inserted into pin-through holes 74 of the printed-circuit board 44A, as shown in FIG. 2. Based on this, the heat generated by the second power-handling unit 42A can be transferred to the power supply housing 14 through the second heat transfer medium 44, resulting in efficient heat dissipation.

Among the power-handling units shown in FIGS. 4 and 5 is a magnetic power unit 42B that comprises a magnetic core 76 and windings 78. Any of the thermal resistors 44A, 44B, 44C, 44D already described are available to dissipate heat from the magnetic power unit 42B, either alone or in various combinations. In some embodiments, the windings 78 are soldered onto the printed-circuit board 44A to transmit heat thereto.

As a failsafe measure, in some cases it is useful to provide an emergency blower 80 having a temperature measurement device, such as a thermocouple 82, and a switch 84 that causes the emergency blower 80 to turn on in case, for whatever reason, an unsustainably high temperature is reached. Such an emergency blower 80 would not be expected to ever be activated during the lifetime of a power supply 12. However, it is available in case of emergencies.

Accordingly, the emergency blower 80 plays a role similar to an emergency sprinkler system in an office building. Just as an emergency sprinkler is not activated on a daily basis to cool the inhabitants of the office, so too is the emergency blower 80 not activated on a daily basis to cool the power supply. Just as it is common for a sprinkler system to never be activated during a building's lifetime, it is also common for the emergency blower 80 to never be activated during the power supply's lifetime.

Figure 6:
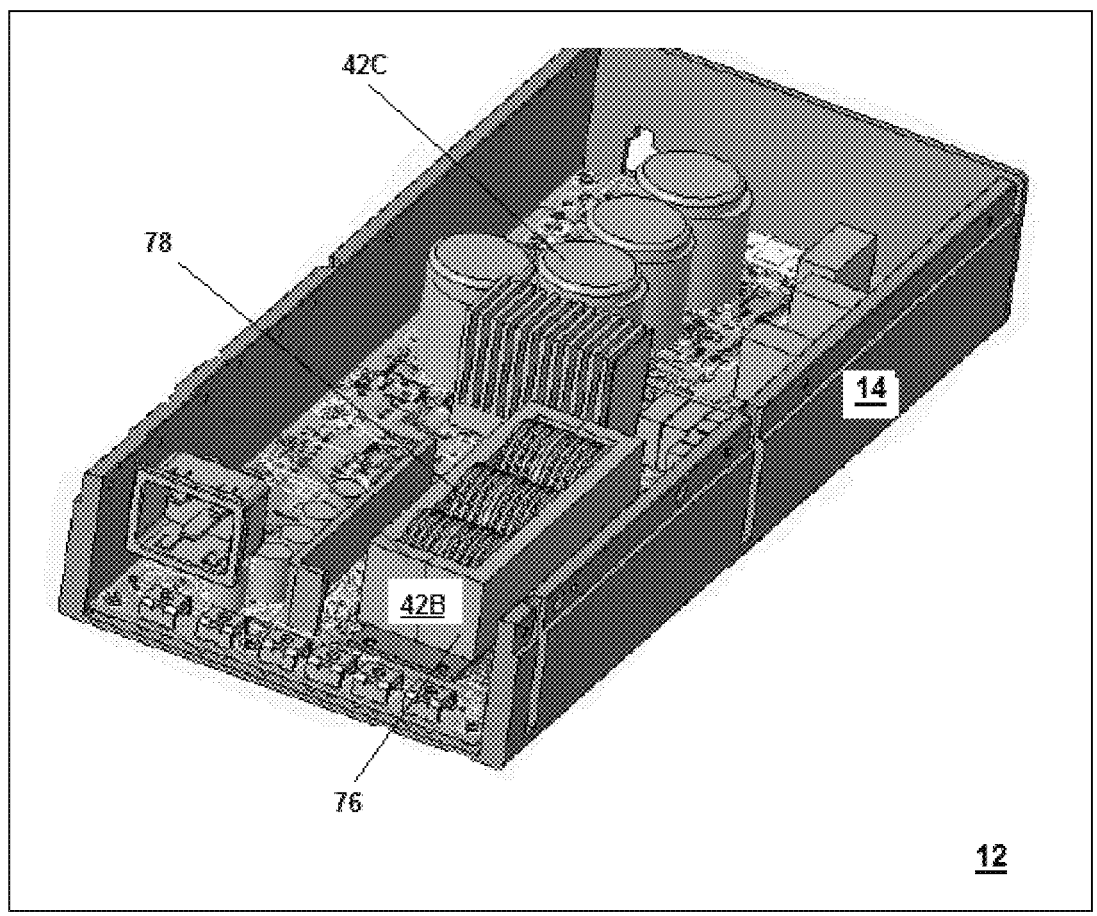
FIG. 6 shows an isometric view of a power supply having a magnetic power-unit in its power train.

As can be seen from FIG. 6, the physical structure of a typical transformer 42B is often not conducive to heat transfer by conduction. The transformer's windings 78, for example, tend to define a curved surface and the core 76 that accommodates the windings 78 has recesses that are difficult to place in contact with a conductive medium. It is therefore useful to take certain additional measures to promote heat transfer from the transformer 42B.

Figure 7:
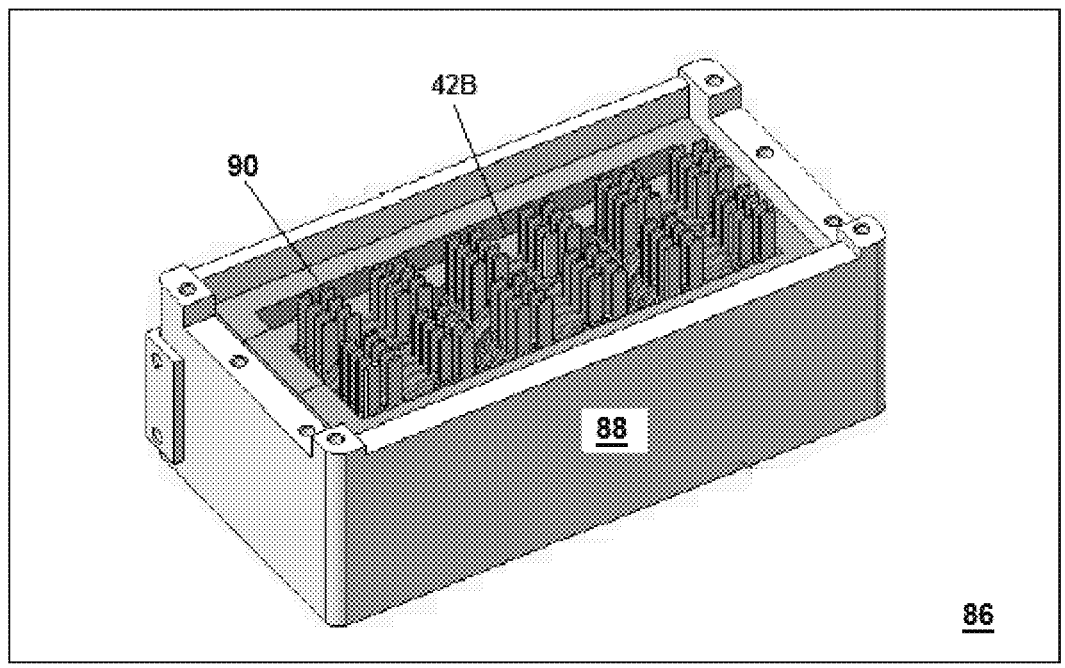
FIG. 7 shows a casing around the magnetic power-unit of FIG. 6.

To promote heat conduction, it is useful to immerse the transformer 42B in a polymer-filled tank 86. A suitable tank 86 is shown in FIG. 7 with its cap omitted to show its internal structure. The tank 86 comprises thermally conductive tank walls 88. Within the tank are additional heat-conducting strips 90 that further promote heat transfer to the tank walls 88.

Figure 8:
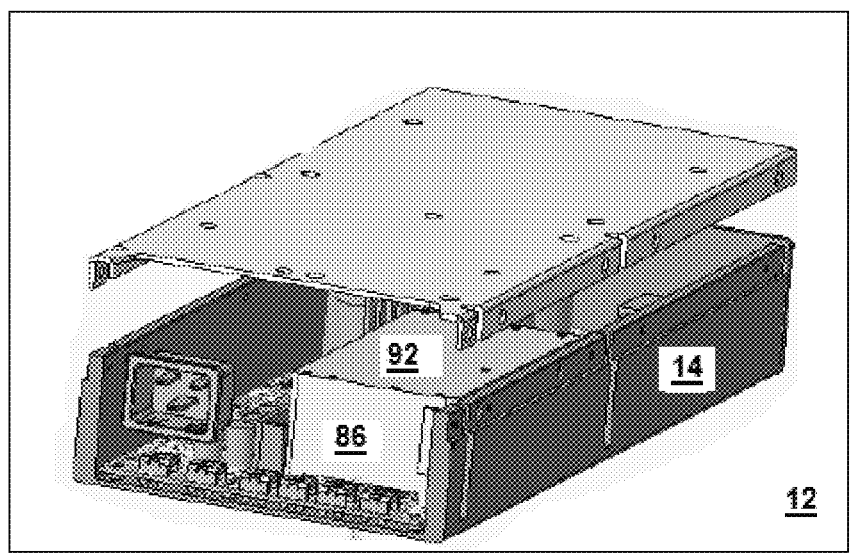
FIG. 8 shows the magnetic power-unit of FIG. 7 after having been encased in a polymer-filled tank.

FIG. 8 shows the power supply 12 of FIG. 11 with the transformer 42B now having been enclosed by the tank 86 shown in FIG. 7. In FIG. 8 the tank's cover 92 is shown as having dimensions commensurate with the tank 86. However, in some embodiments, the cover's dimensions are considerably larger than those of the tank 86, thus enabling heat from the tank 86 to be spread out over more of the housing 14.

Figure 9:
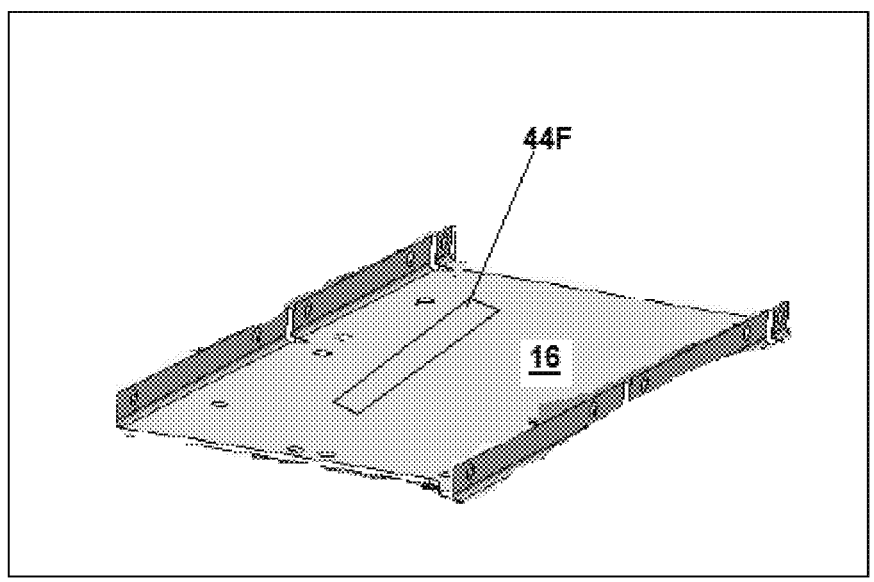
FIG. 9 shows an inlaid conductor in one of the faces of the housing of the power supply shown in FIG. 1

FIG. 9 shows example of a thermal resistor is a conducting strip 44F that has been inlaid into a recess on an inside surface of a face 16 of the housing 14. The material from which the conducting strip 44F is made is one whose conductivity is greater than that of the material from which the housing 14 is made. For an aluminum housing 14, suitable materials for the conducting strip 44F are copper or graphite. In the embodiment shown in FIG. 9, the conducting strip 44F has been strategically placed on the inside surface of the housing's roof so that it contacts one or more power units 42C.

As used herein, "thermal communication" is intended to refer to heat transfer by conduction. Thus, two bodies are said to be in thermal communication if heat transfer takes place by conduction, as distinct from convection and radiation. The term "thermal communication" does not mean simply that heat transfer takes place. For example, given the meaning of "thermal communication" as used herein, it would be incorrect to say that the Earth and the Sun are in "thermal communication" even though heat is transmitted through space. This is because heat transfer is not via conduction.

It is to be understood that the foregoing description is intended to illustrate and not to limit the scope of the invention, which is defined by the scope of the appended claims. Other embodiments are within the scope of the following claims.

It should also be noted that the embodiments and the features in the embodiments of the utility model can be combined with each other without conflict. The utility model will be described in detail below with reference to the accompanying drawings and in conjunction with the embodiments.

What is claimed is:

1. An apparatus comprising a cryptocurrency mining rig for mining cryptocurrency, said cryptocurrency mining rig comprising an ac/dc power supply, said power supply comprising power-handling circuitry and a passive heat-dissipation system that passively dissipates heat generated by said power-handling circuitry, wherein said passive heat-dissipation system comprises a housing that encloses said power-handling circuitry and a thermal network that provides solid-state thermally-conductive pathways between said power-handling circuitry and faces of said housing, wherein said power-handling circuitry comprises a power-handling unit that is connected to first and second faces of said housing by corresponding first and second solid-state thermally-conductive pathways, and wherein said thermal network comprises a structure selected from the group consisting of: a first structure, which comprises a multi-layer printed-circuit board comprising a plurality of heat-conducting layers and an electromagnetic-interference shield that is in thermal communication with said multi-layer printed-circuit board and wherein said power-handling circuitry comprises a power unit that is surface mounted onto said multi-layer printed-circuit board and that is in thermal communication with said plurality of heat-conducting layers; a second structure, which comprises a projection that is in thermal communication with said housing, that projects into said housing, and that has a recess, wherein said power-handling circuitry comprises a power unit that is nestled in said recess, and wherein said recess conforms to said power unit; a third structure, which comprises a grounded conducting plate that is between a power unit of said power-handling circuitry and said housing; a fourth structure, which comprises a perforated graphene layer having perforations filled with a thermally-conductive material; a fifth structure, which comprises a polymer-filled tank having walls in contact with said housing, and wherein said power-handling circuitry comprises a component immersed in said tank; and a sixth structure, which comprises a conducting strip inlaid into said housing, said conducting strip having a thermal resistance that is lower than that of said housing.

2. The apparatus of claim 1, wherein said thermal network comprises said first structure and wherein a heat-conductive medium disposed between said multi-layer printed-circuit board and said housing.

3. The apparatus of claim 1, wherein said thermal network comprises said first structure, wherein said multi-layer printed-circuit board of said first structure comprises an opening, wherein said power-handling circuitry comprises said power unit, and wherein said power unit comprises a portion that passes through said opening so as to be in thermal communication with said housing.

4. The apparatus of claim 1, wherein said thermal network comprises said first structure and wherein said power-handling circuitry comprises said power unit that is surface mounted onto said multi-layer printed-circuit board of said first structure and that is in thermal communication with said plurality of heat-conducting layers.

5. The apparatus of claim 1, wherein said thermal network comprises said first structure and a metal plane in thermal communication with said multi-layer printed-circuit board of said first structure.

6. The apparatus of claim 1, wherein said thermal network comprises said first structure.

7. The apparatus of claim 1, wherein said thermal network comprises said second structure, wherein said projection comprises a thermally-conductive body having an end that is in thermal communication with a face of said housing and wherein said power unit is in thermal communication with said thermally-conductive body, whereby heat generated by said power unit is conducted to said housing through said thermally-conductive body.

8. The apparatus of claim 1, wherein said thermal network comprises said second structure.

9. The apparatus of claim 1, wherein said thermal network comprises said third structure.

10. The apparatus of claim 1, wherein said thermal network further comprises a thermally-conductive adhesive, wherein said power-handling circuitry comprises said power unit, said power unit being in thermal communication with said adhesive, and wherein said adhesive is disposed between said power unit and said housing, whereby said power unit is in thermal communication with said housing via said adhesive, wherein said power unit is any of said first, second, and third structures.

11. The apparatus of claim 1, wherein said thermal network is in thermal communication with all of said faces of said housing.

12. The apparatus of claim 1, wherein said faces of said housing comprise opposed faces, each of which has a vent and wherein remaining faces of said housing are solid faces that are unperforated.

13. The apparatus of claim 1, further comprising fins on said housing.

14. The apparatus of claim 1, further comprising a heat sensor that senses temperature of said housing.

15. The apparatus of claim 1, further comprising a warning system that provides an alert in response to detecting that a temperature of said housing exceeds a threshold value.

16. The apparatus of claim 1, wherein said power-handling circuitry comprises a power semiconductor device that is in thermal communication with said thermal network.

17. The apparatus of claim 1, wherein said power-handling circuitry comprises an electrolytic capacitor that is in thermal communication with said thermal network.

18. The apparatus of claim 1, wherein said power-handling circuitry comprises a magnetic core and windings that are both in thermal communication with said thermal network.

19. The apparatus of claim 1, wherein said housing comprises walls that are greater than one millimeter in thickness.

20. The apparatus of claim 1, wherein said housing comprises walls that are no thinner than three millimeters.

21. The apparatus of claim 1, wherein said housing is configured to permit air flow to pass through said housing, said air flow being a result of kinetic energy that arises from outside said housing.

22. The apparatus of claim 1, wherein said thermal network comprises said fourth structure and a printed-circuit board, wherein graphene in said perforated graphene layer is disposed between said printed-circuit board and said housing, said graphene being perforated and having thermally-conductive material filling said perforations.

23. The apparatus of claim 1, wherein said thermal network comprises said fourth structure.

24. The apparatus of claim 1, wherein said cryptocurrency mining rig comprises a mining machine that receives power from said ac/dc power supply.

25. The apparatus of claim 1, wherein said structure comprises said fifth structure.

26. The apparatus of claim 1, wherein said thermal network comprises said fifth structure.

27. The apparatus of claim 1, wherein said thermal network comprises said sixth structure.

28. The apparatus of claim 1, wherein said ac/dc power supply is rated to output at least three thousand watts of power during steady-state operation.

29. An apparatus comprising a cryptocurrency mining rig for mining cryptocurrency, said cryptocurrency mining rig comprising an ac/dc power supply, said power supply comprising power-handling circuitry and a passive heat-dissipation system that passively dissipates heat generated by said power-handling circuitry, wherein said passive heat-dissipation system comprises a housing that encloses said power-handling circuitry and a thermal network that provides solid-state thermally-conductive pathways between said power-handling circuitry and faces of said housing, and wherein said power-handling circuitry comprises a power-handling unit that is connected to first and second faces of said housing by corresponding first and second solid-state thermally-conductive pathways, said cryptocurrency mining rig further comprising an emergency blower, a switch, and a thermocouple, wherein said blower is disposed inside said ac/dc power supply and wherein said switch is configured to activate said blower in response to a measurement from said thermocouple.

30. An apparatus comprising a cryptocurrency mining rig for mining cryptocurrency, said cryptocurrency mining rig comprising an ac/dc power supply, said power supply comprising power-handling circuitry and a passive heat-dissipation system that passively dissipates heat generated by said power-handling circuitry, wherein said passive heat-dissipation system comprises a housing that encloses said power-handling circuitry and a thermal network that provides solid-state thermally-conductive pathways between said power-handling circuitry and faces of said housing, wherein said power-handling circuitry comprises a power-handling unit that is connected to first and second faces of said housing by corresponding first and second solid-state thermally-conductive pathways, and wherein said faces of said housing are made of a material having a first thermal-conductivity that has been coated with a material of second thermal-conductivity, said second thermal-conductivity being greater than said first thermal-conductivity.

* * * * *